(12) United States Patent
Luo et al.

(10) Patent No.: US 12,389,553 B2
(45) Date of Patent: Aug. 12, 2025

(54) METHOD FOR FORMING POWER MODULE PACKAGE, POWER MODULE PACKAGE AND ELECTRONIC DEVICE

(71) Applicant: Delta Electronics, Inc., Taoyuan (TW)

(72) Inventors: Quansong Luo, Shanghai (CN); Yanbing Xia, Shanghai (CN); Yanggui Feng, Shanghai (CN); Xi Liu, Shanghai (CN); Kaijian Yang, Shanghai (CN); Liang Jin, Shanghai (CN)

(73) Assignee: Delta Electronics, Inc., Taoyuan (TW)

( * ) Notice: Subject to any disclaimer, the term of this patent is extended or adjusted under 35 U.S.C. 154(b) by 197 days.

(21) Appl. No.: 18/372,441

(22) Filed: Sep. 25, 2023

(65) Prior Publication Data

US 2024/0172375 A1 May 23, 2024

(30) Foreign Application Priority Data

Nov. 22, 2022 (CN) .......................... 202211467476.7

(51) Int. Cl.
*H05K 5/00* (2025.01)
*H05K 3/32* (2006.01)
*H05K 3/34* (2006.01)

(52) U.S. Cl.
CPC ........... *H05K 5/0069* (2013.01); *H05K 3/328* (2013.01); *H05K 3/3415* (2013.01); *H05K 3/3457* (2013.01)

(58) Field of Classification Search
CPC .... H05K 5/0069; H05K 3/328; H05K 3/3415; H05K 3/3457

USPC ......................................................... 361/748
See application file for complete search history.

(56) References Cited

U.S. PATENT DOCUMENTS

| 2014/0029201 | A1* | 1/2014 | Yang | ........................ | H01L 24/19 |
| | | | | | 361/813 |
| 2015/0103498 | A1* | 4/2015 | Lee | .................... | H01L 23/49811 |
| | | | | | 361/728 |

FOREIGN PATENT DOCUMENTS

| CN | 111769090 A | 10/2020 |
| CN | 112271165 A | 1/2021 |

* cited by examiner

*Primary Examiner* — Andargie M Aychillhum
(74) *Attorney, Agent, or Firm* — KIRTON McCONKIE; Evan R. Witt

(57) ABSTRACT

A method for forming a power module package includes providing a power module including an electrical element and an electrical connection portion; providing an electrical connection terminal including a connection end, an extension portion and an end cap, wherein the extension portion is extended between the connection end and the end cap and has a hollow cavity therein; disposing the electrical connection terminal on the electrical connection portion for electrically connecting the connection end to a corresponding electrical connection portion; packaging the power module and the electrical connection terminal through an encapsulant to form a packaged body; removing a portion of a surface of the packaged body for exposing the end cap of the electrical connection terminal; and removing the end cap to expose the hollow cavity of the electrical connection terminal, so as to form the power module package.

20 Claims, 17 Drawing Sheets

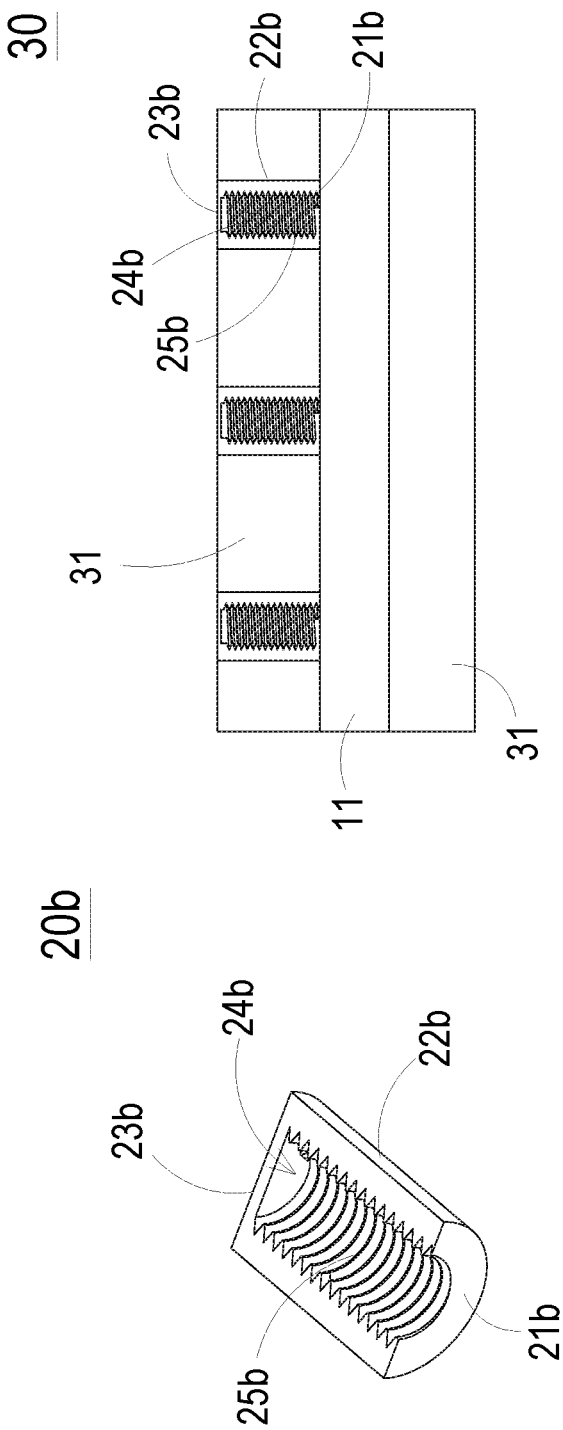

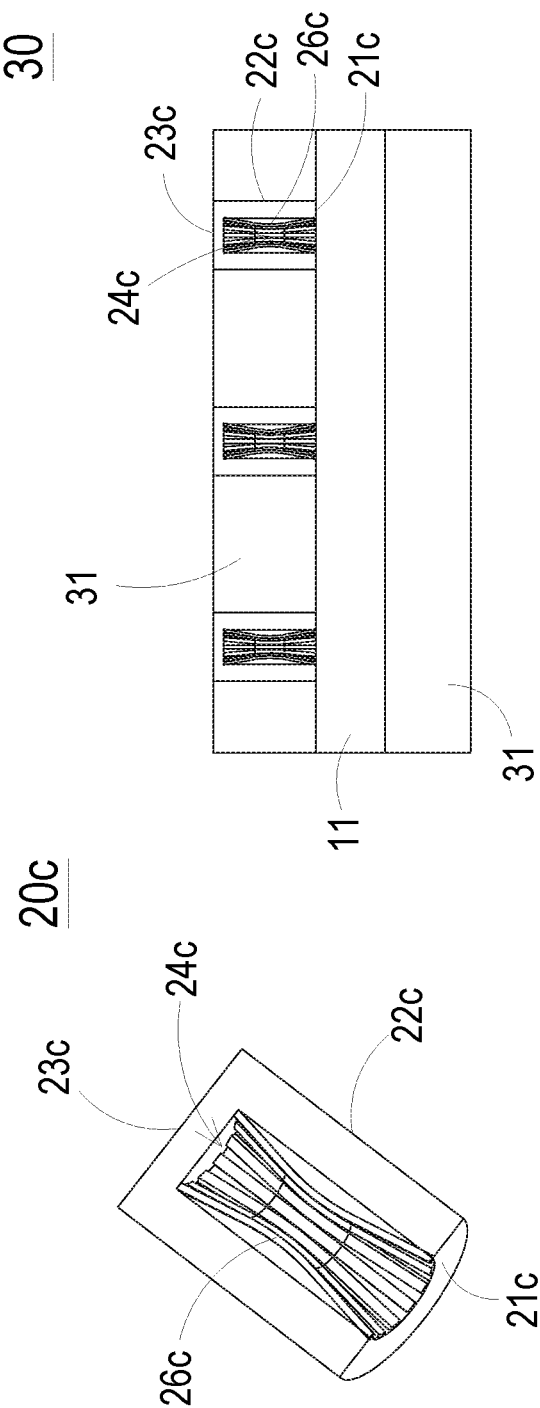

US 12,389,553 B2

METHOD FOR FORMING POWER MODULE PACKAGE, POWER MODULE PACKAGE AND ELECTRONIC DEVICE

CROSS-REFERENCE TO RELATED APPLICATION

This application claims priority to China Patent Application No. 202211467476.7 filed on Nov. 22, 2022. The entire contents of the above-mentioned patent application are incorporated herein by reference for all purposes.

FIELD OF THE INVENTION

The present disclosure relates to a technical field of electronic module packaging, and more particularly to a method for forming a power module package, the power module package and an electronic device including thereof.

BACKGROUND OF THE INVENTION

Electronic modules, such as, power modules, are usually packaged by an encapsulant, such as a filling and sealing material with a particular function, to form a specific appearance for further application. Through the packaging process, the circuitry of the power module is sealed within the encapsulant to form a packaged body.

In order to extend the electrical connection of the internal circuitry to the surface of the packaged body, so as to provide the electrical connection with the external for the circuit system inside the package, the common method is to include leads, metal pins, conductive terminals and/or metal frames therein. Since these electrical connection structures are the bridging connections for the packaged power module to the external, a protection process is necessary for ensuring the integrity of the electrical connection structures after the packaging process.

However, the inventors recognize that the current protection process may increase the difficulties in performing the packaging process.

SUMMARY OF THE INVENTION

The present disclosure provides a method for forming a power module package, the power module package and an electronic device including thereof.

In accordance with an aspect of the present disclosure, a method for forming a power module package is provided. The method includes providing a power module, wherein the power module includes at least one electrical element and at least one electrical connection portion; providing at least one electrical connection terminal, wherein each of the at least one electrical connection terminal includes a connection end, an extension portion and an end cap, the extension portion is extended between the connection end and the end cap, and the extension portion includes a hollow cavity therein; disposing the at least one electrical connection terminal respectively and correspondingly on the at least one electrical connection portion, so as to electrically connect the connection end of each of the at least one electrical connection terminal to a corresponding electrical connection portion; packaging the power module and the at least one electrical connection terminal through an encapsulant to form a packaged body; removing at least one portion of a surface of the packaged body for exposing the end cap of each of the at least one electrical connection terminal; and removing the end cap to expose the hollow cavity of each of the at least one electrical connection terminal, so as to form the power module package.

In accordance with another aspect of the present disclosure, a power module package is provided. The power module package includes a power module including at least one electrical element and at least one electrical connection portion; at least one electrical connection terminal correspondingly and respectively disposed on the at least one electrical connection portion, wherein each of the at least one electrical connection terminal includes a connection end, an extension portion and an end cap, the extension portion is extended between the connection end and the end cap and includes a hollow cavity therein, and the connection end of each of the at least one electrical connection terminal is electrically connected to a corresponding electrical connection portion; and an encapsulant for packaging the power module and the at least one electrical connection terminal to form a packaged body, wherein at least one portion of a surface of the packaged body corresponding to each of the at least one electrical connection terminal is removed, and the end cap of each of the at least one electrical connection terminal is further removed to expose the hollow cavity of each of the at least one electrical connection terminal.

In accordance with a further aspect of the present disclosure, an electronic device is provided. The electronic device includes a system circuit board and a power module package. The power module package includes a power module including at least one electrical element and at least one electrical connection portion; at least one electrical connection terminal respectively and correspondingly disposed on the at least one electrical connection portion, wherein each of the at least one electrical connection terminal includes a connection end, an extension portion and an end cap, the extension portion is extended between the connection end and the end cap and includes a hollow cavity therein, and the connection end of each of the at least one electrical connection terminal is electrically connected to a corresponding electrical connection portion; and an encapsulant for packaging the power module and the at least one electrical connection terminal to form a packaged body, wherein at least one portion of a surface of the packaged body corresponding to each of the at least one electrical connection terminal is removed, and the end cap of each of the at least one electrical connection terminal is further removed to expose the hollow cavity of each of the at least one electrical connection terminal. The power module package is electrically connected to the system circuit board through the at least one electrical connection terminal.

BRIEF DESCRIPTION OF THE DRAWINGS

The above contents of the present disclosure will become more readily apparent to those ordinarily skilled in the art after reviewing the following detailed description and accompanying drawings, in which:

FIG. 3A is a sectional view showing an electrical connection terminal in a second embodiment according to the present disclosure;

FIG. 3B is a sectional view of the A-A' plane of the electrical connection terminal as being disposed in a packaged body in the second embodiment according to the present disclosure;

FIG. 4A is a sectional view showing an electrical connection terminal in a third embodiment according to the present disclosure;

FIG. 4B is a sectional view of the A-A' plane of the electrical connection terminal as being disposed in a packaged body in the third embodiment according to the present disclosure;

DETAILED DESCRIPTION OF THE INVENTION

The present disclosure will now be described more specifically with reference to the following embodiments. It is to be noted that the following descriptions of the embodiments are presented herein for purpose of illustration and description only. It is not intended to be exhaustive or to be limited to the precise form disclosed.

Figure 1A:
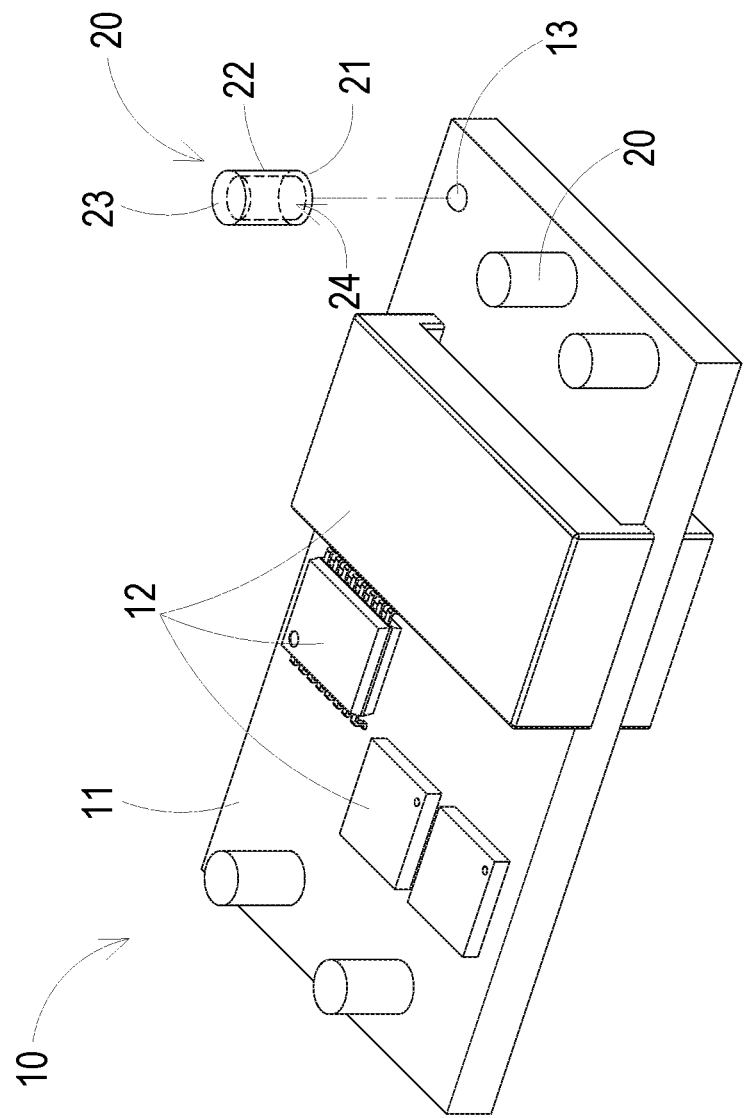
FIGS. 1A to 1C are schematic views showing a process for forming a power module package according to some embodiments of the present disclosure.
Figure 1B:
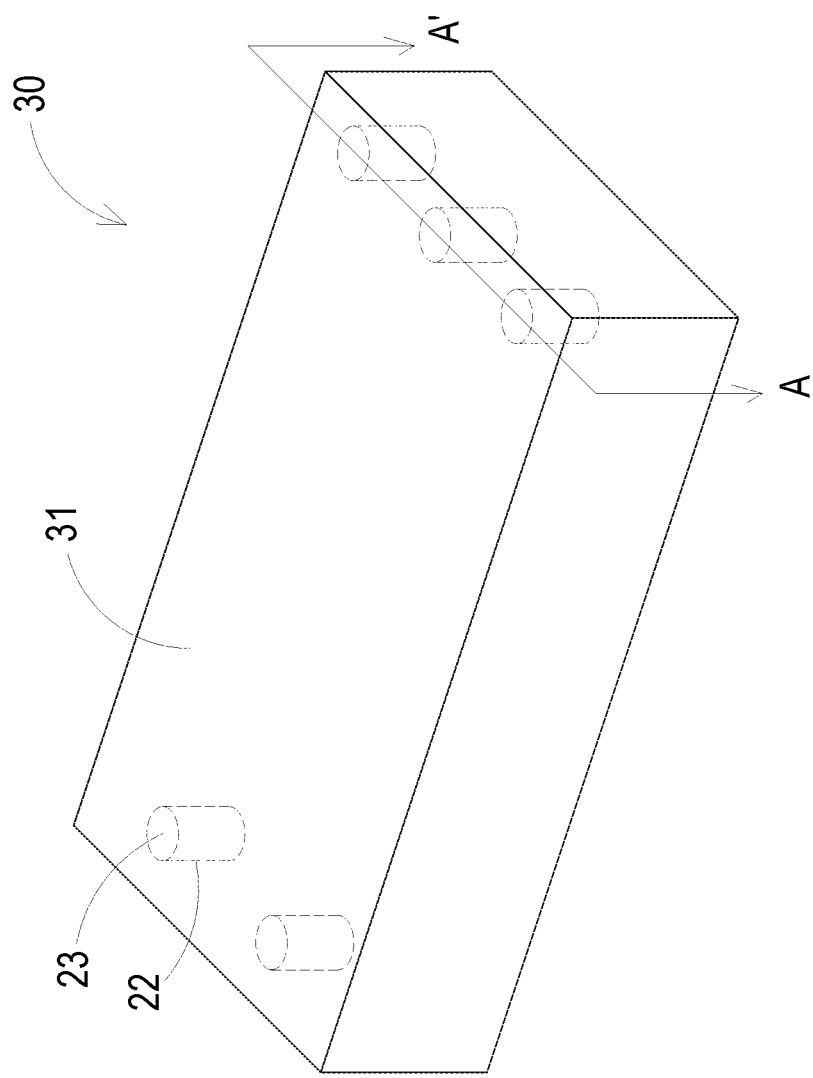
Figure 1C:
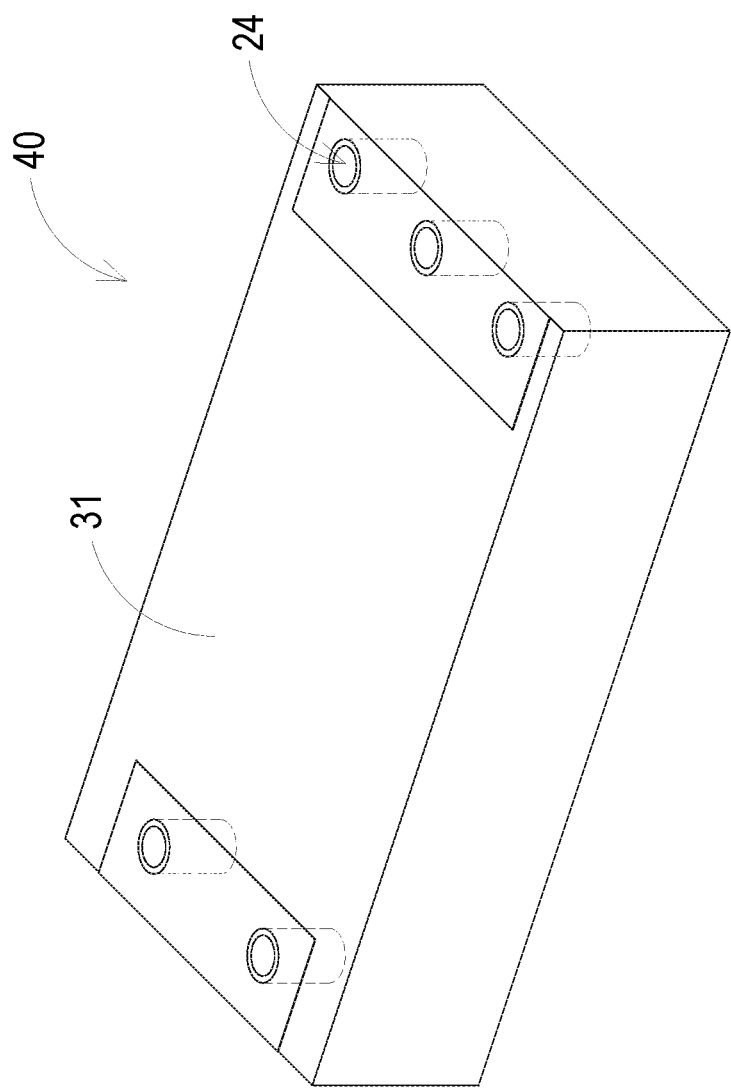
Figure 1D:
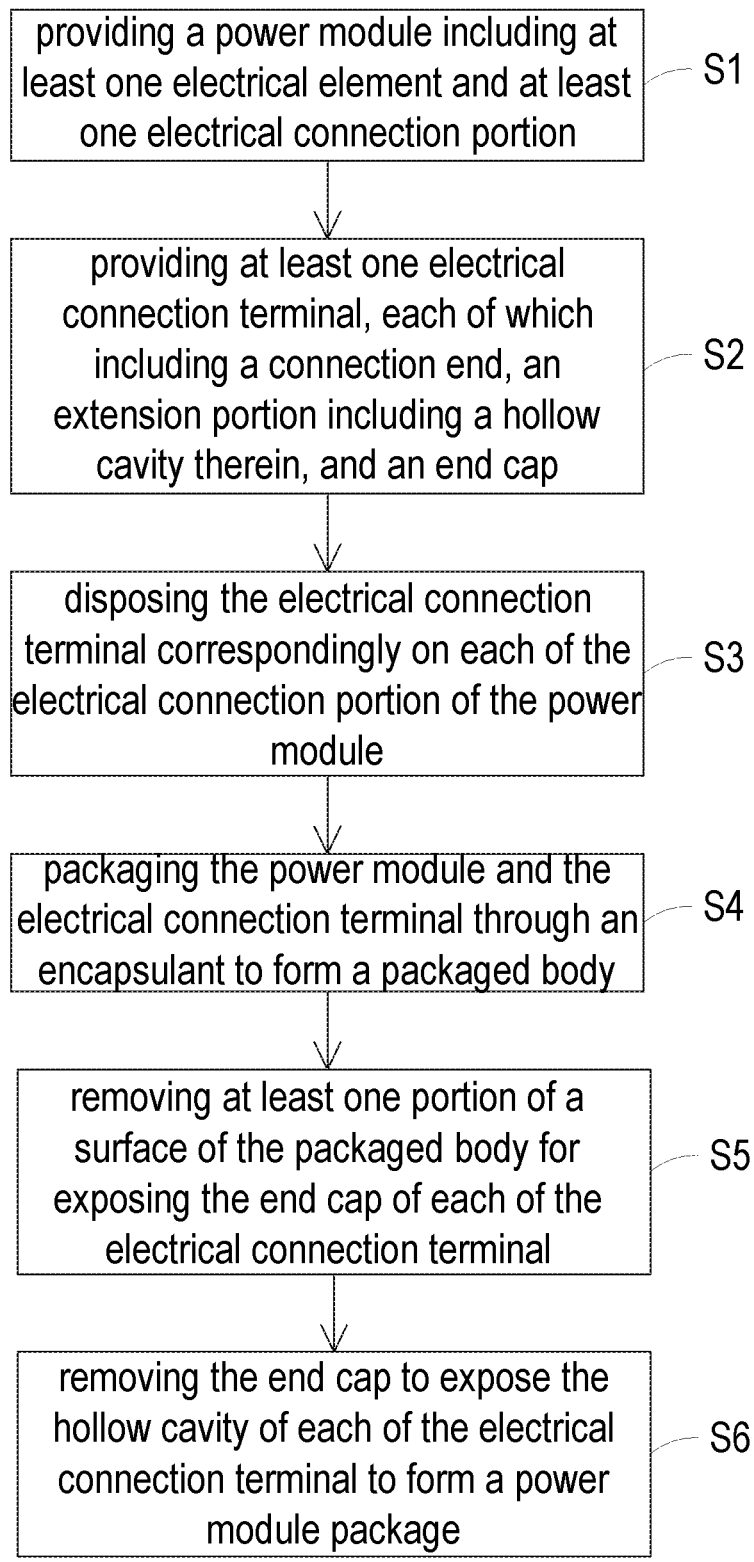
FIG. 1D is a flow chart showing a method for forming the power module package according to some embodiments of the present disclosure.

Please refer to FIGS. 1A to 1D. FIGS. 1A to 1C are schematic views showing a process for forming a power module package according to some embodiments of the present disclosure, and FIG. 1D is a flow chart showing a method for forming the power module package according to some embodiments of the present disclosure. First, in step S1, a power module 10 to be packaged is provided. The power module 10 includes a circuit board 11, at least one electrical element 12, and at least one electrical connection portion 13 for achieving an external electrical connection. In steps S2 to S3, before packaging, an electrical connection terminal 20 is disposed on each of the at least one electrical connection portion 13 so as to form an electrical connection therebetween. Each electrical connection terminal 20 includes a connection end 21, an extension portion 22, an end cap 23, and a hollow cavity 24 extended into the extension portion 22, and the connection end 21 is electrically connected to the electrical connection portion 13. In step S4, an encapsulant 31 is used to package the power module 10 and the electrical connection terminal 20 for forming a packaged body 30. Then, in step S5, at least one portion of the surface of the packaged body 30 corresponding to location of the electrical connection terminal 20 is removed, so as to expose the end cap 23 of the electrical connection terminal 20. In step S6, the exposed end cap 23 is also removed to expose the hollow cavity 24 of each electrical connection terminal 20, thereby forming a power module package 40.

In other words, before the power module 10 is packaged, the electrical connection terminal 20 is already disposed on the power module 10 and electrically connected to the electrical connection portion 13, and the electrical connection portion 13 is used to achieve the external electrical connection. Under this condition, since the electrical connection terminal 20 includes the end cap 23, the hollow cavity 24 is reliably protected thereby during the packaging process. After the packaging is finished, a simple process of removing a portion of the surface of the packaged body 30 and also the end cap 23 can easily performed to provide a pathway for the power module 10 to achieve the external electrical connection.

Generally, the formed power module package 40 is used in an electronic device and is electrically connected to a system circuit board of the electronic device through the exposed electrical connection terminal 20 after the removing process. Accordingly, the power module package 40 can perform a power and signal exchange with the external through the electrical connection terminal 20, thereby achieving the purpose of transmitting electric energies and signals.

The electrical connection terminal 20 is made of an electrical conductive material. In some embodiments, the electrical conductive material is a copper, and the connection between the connection end 21 and the electrical connection portion 13 can be fixed through welding, glue bonding and other possible methods. Therefore, through further cooperating with the end cap 23, both the extension of electrical connection and the provision of protection function can be achieved effectively. Moreover, the end cap 23 and the extension portion 22 can be integrally formed as one single element, and alternatively, the end cap 23 and the extension portion 22 also can be combined together, for example, through engaging and adhering, so as to simplify the removing process for the end cap 23. The extension portion 22 is in a form of column, and the shape of the cross-section thereof can be varied without limitation, such as a circle, an ellipse, a square circle, a square and so on. Furthermore, the process for removing the surface of the packaged body 30 and the end cap 23 can be achieved through a simple process, such as grinding or cutting, without requiring complicated steps, so that the influence on the power module 10 inside the packaged body 30 is minor.

Therefore, the method for forming the power module package in the present disclosure is advantageous of capable of protecting the electrical connection portion 13 during the packaging process, employing a simple removing process, and having minor influence on the power module 10.

As described above, after the end cap 23 is removed, the hollow cavity 24 extended into the extension portion 22 is exposed at the surface of the power module package 40, and the present disclosure utilizes the hollow cavity 24 is utilized in to enhance the applicability of the formed power module package 40. Follows are more detailed descriptions relating to the structure of the electrical connection terminal 20 and the application thereof.

Figures 2A, 2B:
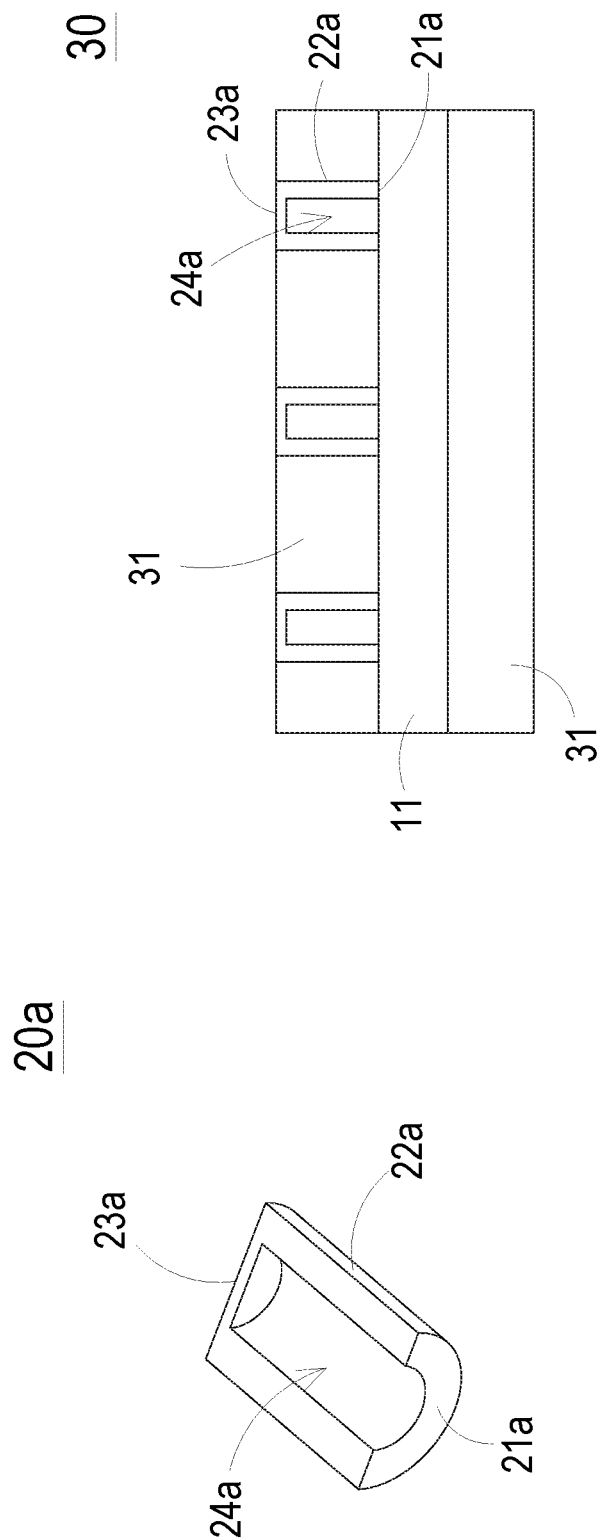
FIG. 2A is a sectional view showing an electrical connection terminal in a first embodiment according to the present disclosure.
FIG. 2B is a sectional view of the A-A' plane of the electrical connection terminal as being disposed in a packaged body in the first embodiment according to the present disclosure.
Figure 2C:
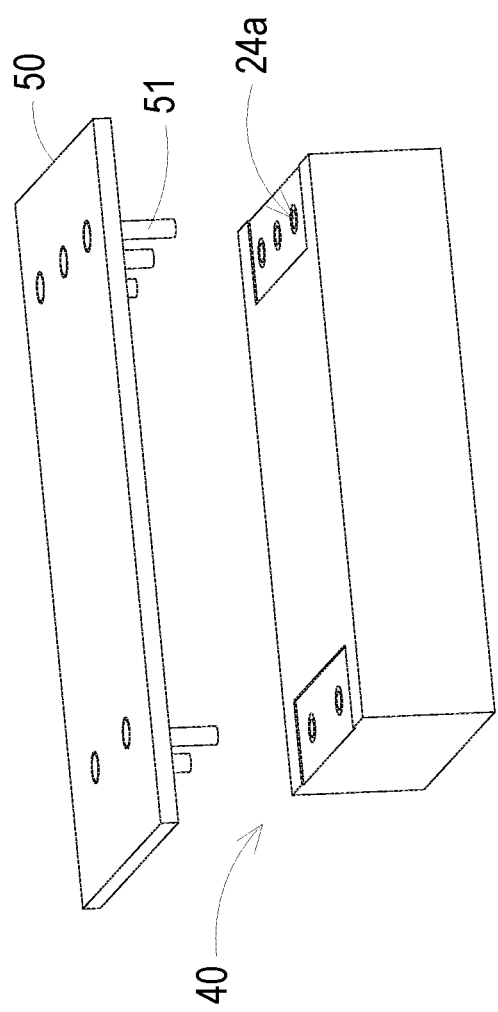
FIG. 2C is a schematic view showing an external connection of a power module package formed from the packaged body in FIG. 2B.

Please refer to FIGS. 2A to 2C. FIG. 2A is a sectional view showing an electrical connection terminal in a first embodiment according to the present disclosure, FIG. 2B is a sectional view of the A-A' plane of the electrical connection terminal as being disposed in a packaged body in the first embodiment according to the present disclosure, and FIG. 2C is a schematic view showing an external connection of a power module package formed from the packaged body in FIG. 2B. In this embodiment, the hollow cavity 24a of the electrical connection terminal 20a penetrates the extension portion 22a, namely, the extension portion 22a is in a form of a hollow column. The end cap 23a is covered on one end of the hollow column of the extension portion 22a opposite to the connection end 21a. The shape of the cross-section of the hollow column can be a circular ring shape, as shown in FIG. 2A. In some embodiments, the shape of the cross-section of the hollow column can be other shapes, such as, a square ring shape, a round-square ring shape, or an oval ring shape.

After portions of the surface of the packaged body 30 and the end caps 23a are removed, as shown in FIG. 2C, the hollow cavities 24a of the electrical connection terminals 20a are exposed at the surface of the power module package 40, and the exposed hollow cavities 24a are used to receive external connection terminals. For example, the external connection terminal can be a terminal pin 51 on an external system board 50, or can be a pin terminal capable of inserting into the hollow cavity 24a. The contact surface between the terminal pin 51 and the hole of the hollow cavity 24a provides the electrical connection between the power module package 40 and the external system board 50. In some embodiments, the external system board 50 can be a system circuit board in an electronic device or a circuit board in other external systems. Consequently, through the connection end 21a of the electrical connection terminal 20a connecting to the electrical connection portion 13 of the circuit board 11 and the terminal pin 51 contacting to the electrical connection terminal 20a, the electrical connection between the external system board 50 and the circuit board 11 can be formed. In some embodiments, through selecting the inner diameter of the hollow cavity 24a and the outer diameter of the external pin terminal, such as the terminal pin 51, the two structures can have a tight engagement therebetween, thereby strengthening the fixing force and thus improving the stability of the formed electrical connection.

Figure 3C:
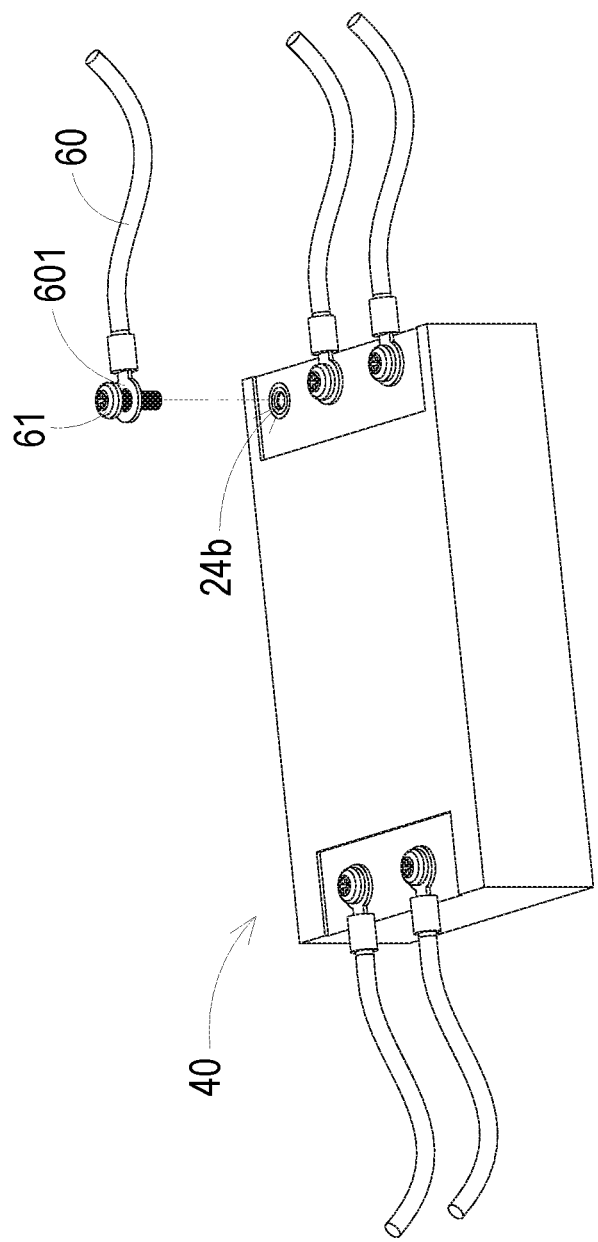
FIG. 3C is a schematic view showing an external connection of a power module package formed from the packaged body in FIG. 3B.

Please refer to FIGS. 3A to 3C. FIG. 3A is a sectional view showing an electrical connection terminal in a second embodiment according to the present disclosure, FIG. 3B is a sectional view of the A-A' plane of the electrical connection terminal as being disposed in a packaged body in the second embodiment according to the present disclosure, and FIG. 3C is a schematic view showing an external connection of a power module package formed from the packaged body in FIG. 3B. In this embodiment, the hollow cavity 24b of the electrical connection terminal 20b identically penetrates the extension portion 22b, so the extension portion 22b is similarly formed in a form of a hollow column. The end cap 23b is covered on one end of the hollow column of the extension portion 22b opposite to the connection end 21b. The difference from the embodiment shown in FIGS. 2A-2C is the inner wall of the hollow cavity 24b has threads 25b formed thereon, so that after portions of the surface of the packaged body 30 and the end caps 23b are removed and the hollow cavities 24b of the electrical connection terminals 20b are exposed, the threads 25b in the hollow cavities 24b are also exposed. Accordingly, the mechanical fixing and the electrical connection between the electrical connection terminal 20b and the external pin terminal can be achieved simultaneously through screwing. For example, as shown in FIG. 3C, a connection head 601 of an external connection wire 60 can be screwed on the power module package 40 through employing an external pin terminal, such as a screw bolt 61, with threads corresponding to the threads 25b. Alternatively, when the external system board 50 in FIG. 2C has through holes disposed thereon, it also can be fixed on the surface of the power module package 40 through passing therethrough the external pin terminals with threads to tightly screw with the threads 25b.

Figure 4C:
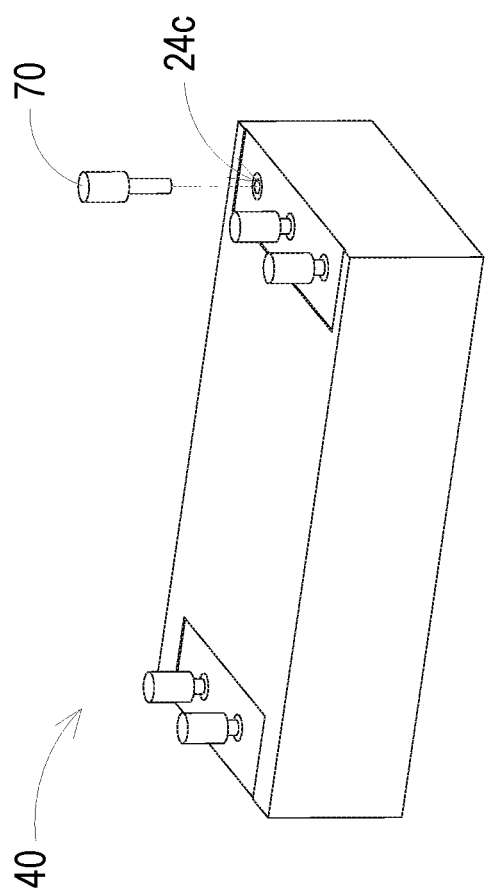
FIG. 4C is a schematic view showing an external connection of a power module package formed from the packaged body in FIG. 4B.

Please refer to FIGS. 4A to 4C. FIG. 4A is a sectional view showing an electrical connection terminal in a third embodiment according to the present disclosure, FIG. 4B is a sectional view of the A-A' plane of the electrical connection terminal as being disposed in a packaged body in the third embodiment according to the present disclosure, and FIG. 4C is a schematic view showing an external connection of a power module package formed from the packaged body in FIG. 4B. In this embodiment, the hollow cavity 24c of the electrical connection terminal 20c identically penetrates the extension portion 22c, so the extension portion 22c is similarly formed in a form of a hollow column. The end cap 23c is covered on one end of the hollow column of the extension portion 22c opposite to the connection end 21c. In this embodiment, an electrical connection fixing element is pre-set in the hollow cavity 24c. In some embodiments, the electrical connection fixing element can be a spring-engaging structure 26c which provides the fixing force through the structure and the material elasticity thereof. Under this condition, after portions of the surface of the packaged body 30 and the end caps 23c are removed and the hollow cavities 24c of the electrical connection terminals 20c are exposed, the spring-engaging structures 26c are also exposed, so that the mechanical fixing and the electrical connection with the external pin terminal can be achieved simultaneously through spring-engaging. For example, the external pin terminal can be a mating terminal 70, as shown in FIG. 4C, for being inserted into the spring-engaging structure 26c inside the hollow cavity 24c. Alternatively, the terminal pin 51 of the external system board 50 as shown in FIG. 2C also can be fixed through engaging with the spring-engaging structure 26c. That is, as long as the diameter of the inserted terminal or pin is within the engaging range of the electrical connection fixing element inside the electrical connection terminal 20c, the engagement for the inserted terminal or pin can be achieved, thereby forming the electrical connection. Further, the electrical connection fixing element also can be implemented into other types of structures, there is no limitation.

Figures 5A, 5B:
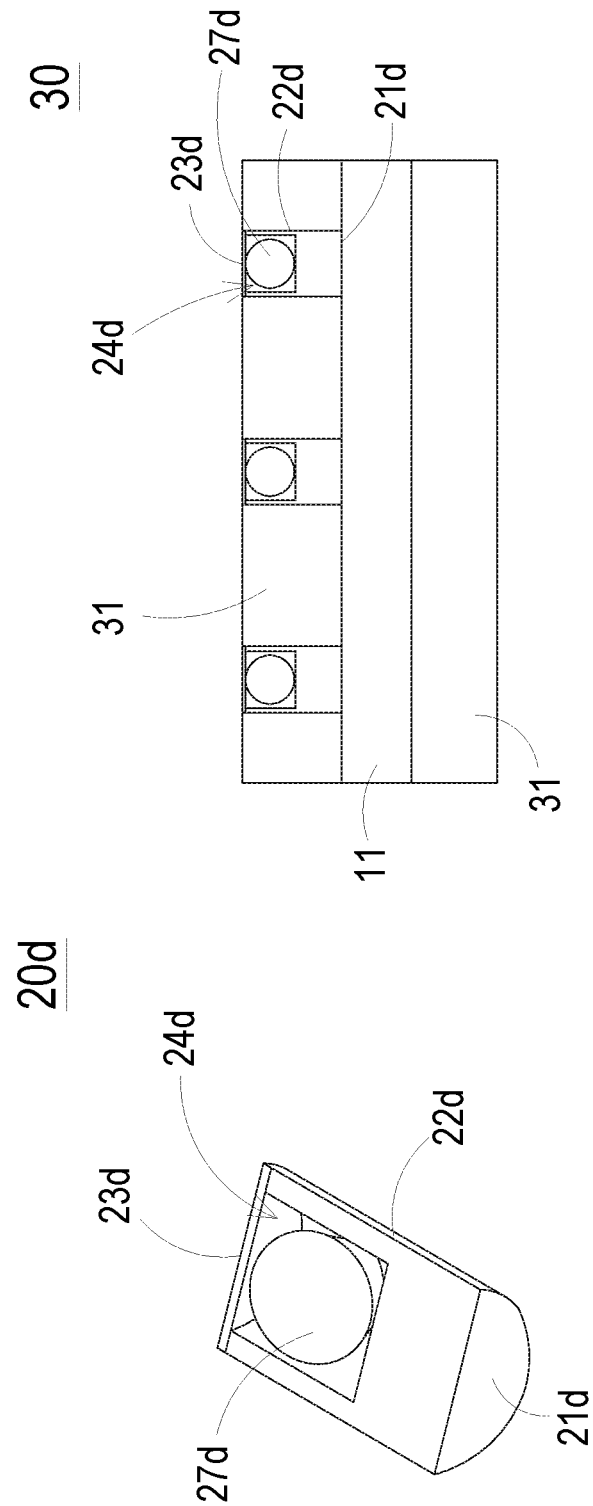
FIG. 5A is a sectional view showing an electrical connection terminal in a fourth embodiment according to the present disclosure.
FIG. 5B is a sectional view of the A-A' plane of the electrical connection terminal as being disposed in a packaged body in the fourth embodiment according to the present disclosure.
Figure 5C:
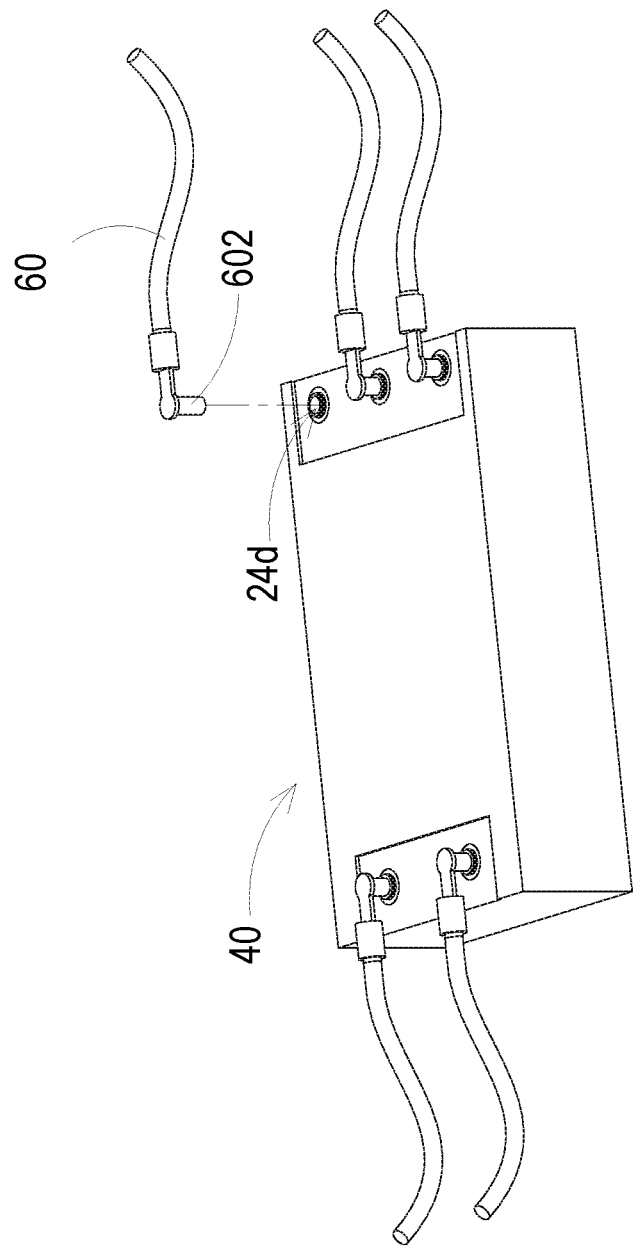
FIG. 5C is a schematic view showing an external connection of a power module package formed from the packaged body in FIG. 5B.

Please refer to FIGS. 5A to 5C. FIG. 5A is a sectional view showing an electrical connection terminal in a fourth embodiment according to the present disclosure, FIG. 5B is a sectional view of the A-A' plane of the electrical connection terminal as being disposed in a packaged body in the fourth embodiment according to the present disclosure, and FIG. 5C is a schematic view showing an external connection of a power module package formed from the packaged body in FIG. 4B. In this embodiment, the connection end 21*d* of the electrical connection terminal 20*d* is a solid plane, and the extension portion 22*d* is a solid column extended from the connection end 21*d* to the end cap 23*d*. In some embodiments, the shape of the cross-section of the hollow column can be a circular shape, a square shape, a round-square shape, or an oval shape. In other words, different from the embodiments above, the hollow cavity 24*d* does not penetrate the extension portion 24*d*, but only occupies a portion of the extension portion 24 adjacent to the end cap 24*d*. Further, a solder material 27*d* is filled in the hollow cavity 24*d*, so that after portions of the surface of the packaged body 30 and the end caps 23*d* are removed and the hollow cavities 24*d* of the electrical connection terminals 20*d* are exposed, the solder materials 27*d* in the hollow cavities 24*d* are also exposed. Accordingly, the external electrical connection of the electrical connection terminal 20*d* can be achieved through welding. For example, after the exposed solder material 27*d* is heated and melted, as shown in FIG. 5C, a plug-in terminal 602 of the external connection wire 60 can be directly inserted into the melted solder material 27*d* to complete the electrical connection. Alternatively, the connection head 601 as shown in FIG. 3C which has a flat shape also can form the electrical connection through a flat welding, such as, through the surface mount technology (SMT). Since the solder material 27*d* is in a fluid state after being heated and melted, the electrical connection terminal 20*d* can adapt to more diverse and extensive types of external connections.

Figures 6A, 6B:
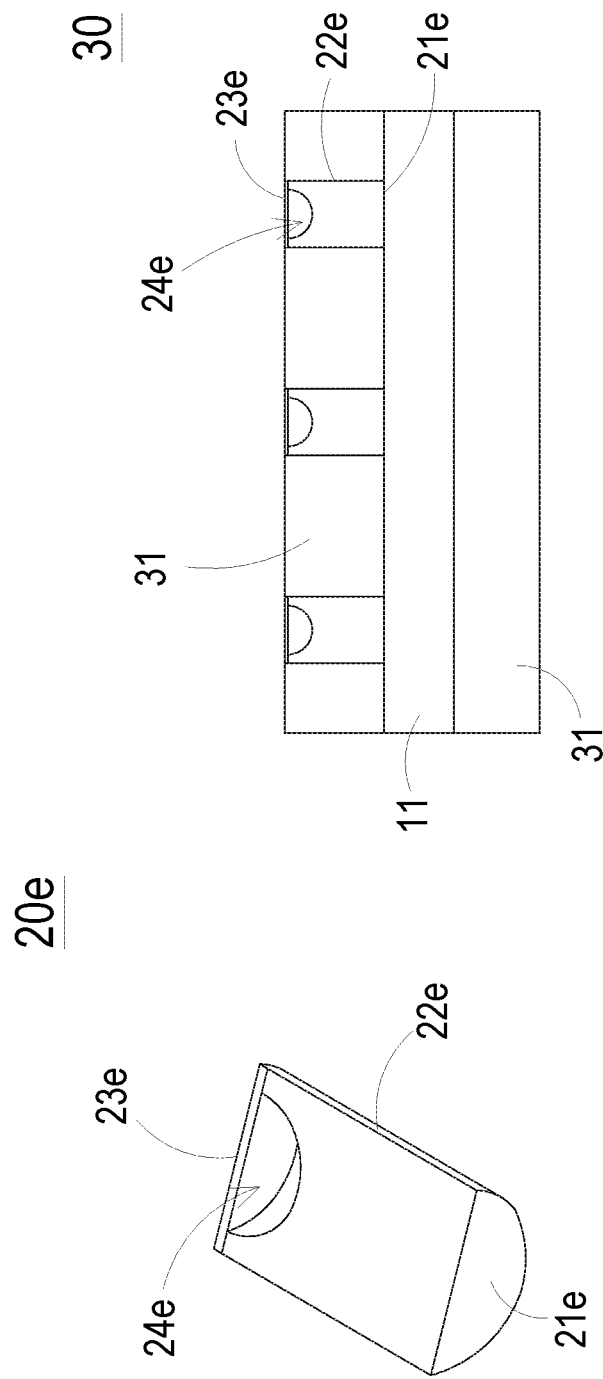
FIG. 6A is a sectional view showing an electrical connection terminal in a fifth embodiment according to the present disclosure.
FIG. 6B is a sectional view of the A-A' plane of the electrical connection terminal as being disposed in a packaged body in the fifth embodiment according to the present disclosure.
Figure 6C:
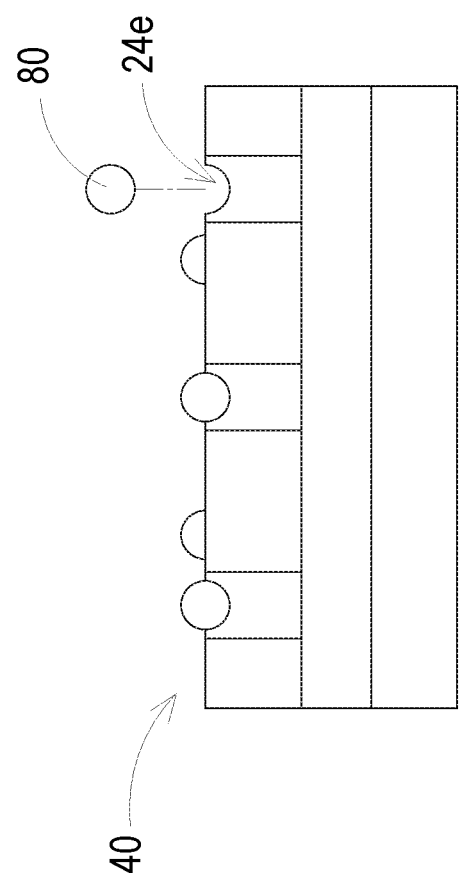
FIG. 6C is a schematic sectional view showing a power module package formed from the packaged body in FIG. 6B with solder balls disposed thereon.

Please refer to FIGS. 6A to 6C. FIG. 6A is a sectional view showing an electrical connection terminal in a fifth embodiment according to the present disclosure, FIG. 6B is a sectional view of the A-A' plane of the electrical connection terminal as being disposed in a packaged body in the fifth embodiment according to the present disclosure, and FIG. 6C is a schematic sectional view showing a power module package formed from the packaged body in FIG. 6B with solder balls disposed thereon. In this embodiment, identically, the connection end 21*e* of the electrical connection terminal 20*e* is a solid plane, the extension portion 22*e* is a column extended from the connection end 21*e* to the end cap 23*e*, and the hollow cavity 24*e* is within the extension portion 24*e* at a location adjacent to the end cap 24*e*. Different from the embodiment in FIGS. 5A-5C, in this embodiment, the hollow cavity 24*e* remains empty until the end cap 23*e* is removed.

As shown in FIG. 6C, after portions of the surface of the packaged body 30 and the end caps 23*e* are removed, one or more hollow cavities 24*e* of the electrical connection terminals 20*e* are exposed at the surface of the power module package 40, which makes the surface of the power module package 40 have one or more recesses. This result structure is suitable for externally adding the solder. For example, in the embodiment shown in FIG. 6C, each exposed hollow cavity 24*e* can accommodate exactly one solder ball 80. In other words, the hollow cavity 24 provides a space for receiving the solder ball 80 when the solder ball 80 passes through the surface of the power module package 40. In some embodiments, the hollow cavity 24*e* is implemented to have an arc bottom surface for receiving the solder ball having a diameter smaller than that of the arc bottom surface, namely, a portion of the surface of the solder ball 80 will be matched with the arc bottom surface.

There are many advantages of employing the solder ball 80. Firstly, since the solder ball 80 is added after the power module package 40 is formed, the amount of the solder material for welding can be adjusted through selecting from the solder balls 80 in different sizes to match the required amount for welding with different objects, which provides the flexibility. Moreover, the portion of the solder ball 80 protruding from the surface of the power module package 40 can provide additional solder material at the welding location after being heated and melted, which helps to enhance the reliability after welding. Further, because the solder ball 80 becomes the melted solder material after being heated, it is beneficial to effectively form the electrical connection with different types of external connections.

Figure 7B:
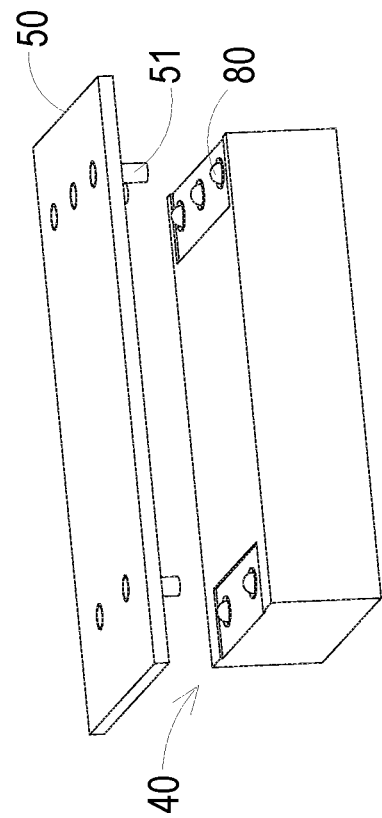
FIGS. 7A to 7F are schematic views showing examples of external electrical connections for the power module package in the fifth embodiment according to the present disclosure.
Figure 7A:
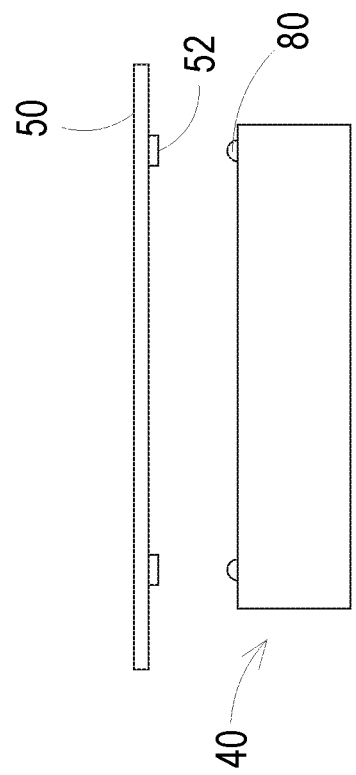

Please refer to FIGS. 7A-7F which are schematic views showing examples of external electrical connections for the power module package in the fifth embodiment according to the present disclosure. In one situation, the power module package 40 directly forms the external electrical connection through the solder ball 80. As shown in FIG. 7A, the solder balls 80 in each of the hollow cavities 80 are correspondingly matched with the pads 52 on the surface of the external system board 50, so that the two can directly welded through a welding process, thereby forming the electrical connection. Further, as shown in FIG. 7B, the external system board 50 can have the terminal pin 51 disposed thereon, so that after the solder ball 80 is heated and melted, the electrical connection can be formed through inserting the terminal pin 51. Alternatively, as shown in FIG. 5C, the electrical connection for the plug-in terminal 602 of the external connection wire 60 also can be welded through inserting, thereby forming the electrical connection. In addition, the connection head 601 of the external connection wire 60 as shown in FIG. 3C can be welded through the surface mount technology.

Figure 7D:
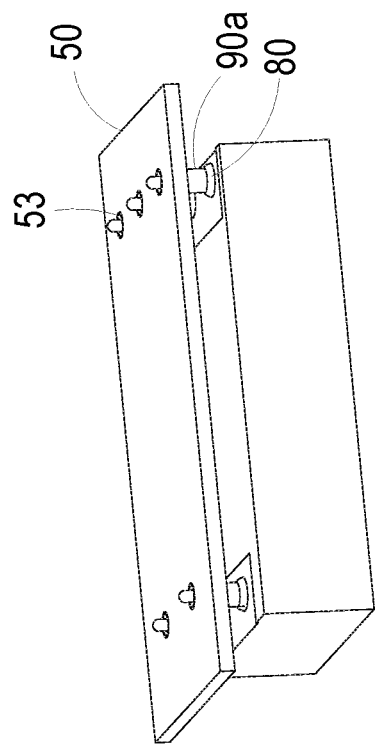
Figure 7C:
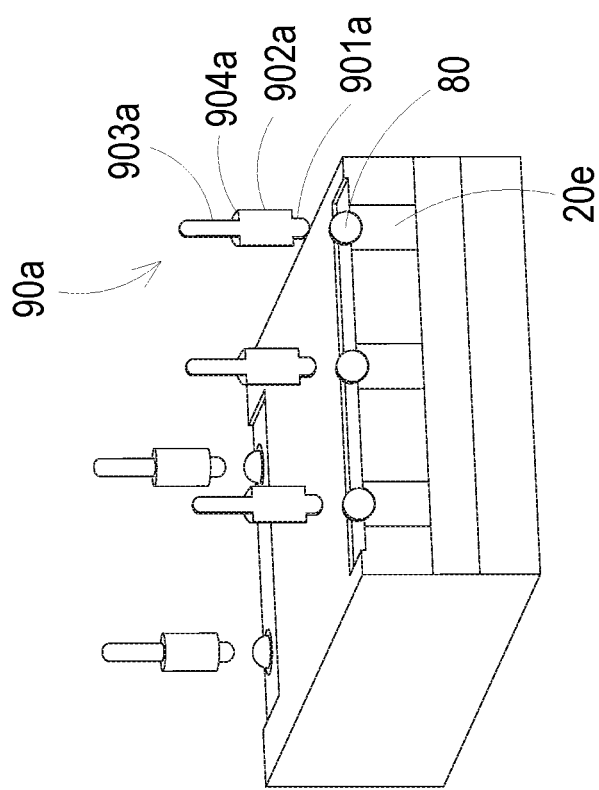
Figure 7F:
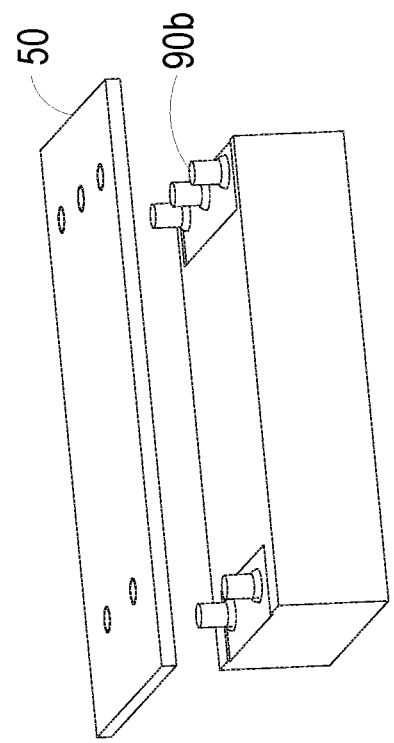
Figure 7E:
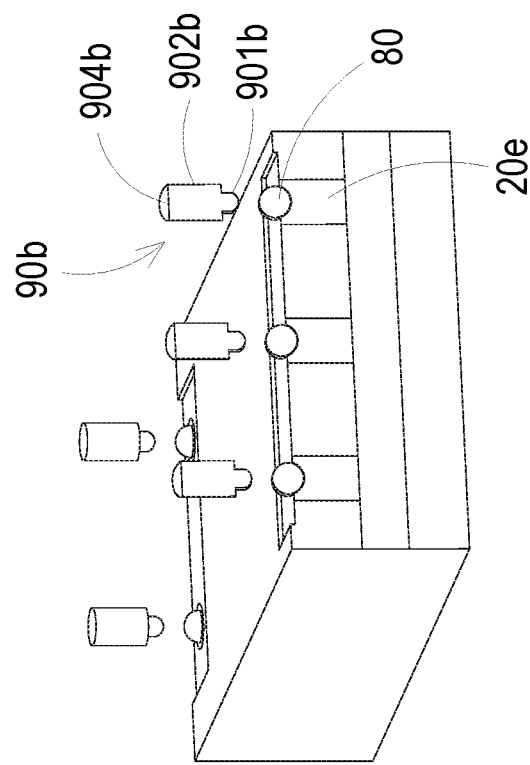

In another situation, the power module package 40 forms the external electrical connection through adopting a bridging terminal. As shown in FIGS. 7C-7D, a bridging terminal 90*a* includes a pin end 901*a*, a support portion 902*a* and a tail end 903*a*. The pin end 901*a* is used to insert into the melted solder material formed by heating the solder ball 80, and after cooling, the bridging terminal 90*a* becomes a portion of the external electrical connection of the power module package 40. The tail end 903*a* is used to penetrate a through hole 53 of the external system board 50 and also to be welded with the external system board 50. The support portion 902*a* has a support surface 904*a* for supporting the external system board 50. Further, as shown in FIGS. 7E-7F, as cooperating with the system board 50 without the through hole, a bridging terminal 90*b* without the tail end can be used. The bridging terminal 90*b* includes a pin end 901*b* for inserting into the melted solder material, and a support portion 902*b* having a support surface 904*b*. Other than supporting the external system board 50, the support surface 904*b* is also used to be welded with the pad on the external system board 50, e.g., through the surface mount technology, so as to form the electrical connection.

The disposition of the bridging terminal is also suitable for the embodiment shown in FIGS. 5A-5C, in which the solder material 27*d* pre-set in the hollow cavity 24*d* also can be used to be welded with the bridging terminal.

Through the additional disposition of the bridging terminal, the application of the power module package 40 of the present disclosure can be increased. Since the type of the external connection of the formed power module package 40 is determined through the electrical connection terminal 20 pre-set therein, the externally added bridging terminal provides the possibility to change the way to achieve the connection. That is, through this design, it only needs to change the bridging terminal, and the existed power module package 40 can therefore provide a different kind of external connection, which eliminates the need to re-form a power module package with different electrical connection terminal 20, and thus can quickly respond to the connection and/or installation requirement as the external connection is changed. For example, when the connection structure on the external system board is changed, e.g., when the external system boards of different clients adopt different connection structures, through employing a corresponding bridging terminal, e.g., selected from bridging terminals for respective clients, the electrical connection still can be achieved. Furthermore, the installation requirements for different system circuit boards in the electronic device might be different, and it is possible to control the distance between the external system board 50 and the power module package 40 through adjusting the height of the support portion, thereby achieving a more effective utilization of the space within the electronic device. Consequently, through the additional disposition of the bridging terminal, one single kind of power module package 40 can be cooperated with multiple kinds of external systems, which advantageously provides the flexibility.

In addition, other than extending the electrical connection portion 13 from the internal circuit board to the surface of the power module package 40, the electrical connection terminal, based on the property of the material thereof, also can achieve the effect of transmitting heats generated inside the power module 10 to the external.

In conclusion, through pre-setting the electrical connection terminal with self-protection function in the power module before packaging, the present disclosure eliminates the need of executing an additional protection process during packaging. Moreover, after the packaging process is finished, it only needs to perform a simple removing process on the packed body, and the portion of the electrical connection terminal for achieving the electrical connection can be easily exposed. Not only the process is simple and the extension of electrical connection can be achieved effectively, the influence on the power module is also minimized. Furthermore, through varying the structure of the electrical connection terminal and cooperating with the bridging terminal, it also can effectively adopt to the requirements of different kinds of external connections, which is a design with application flexibility.

While the disclosure has been described in terms of what is presently considered to be the most practical and preferred embodiments, it is to be understood that the disclosure needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method for forming a power module package, comprising:
   providing a power module, wherein the power module comprises at least one electrical element and at least one electrical connection portion;
   providing at least one electrical connection terminal, wherein each of the at least one electrical connection terminal comprises a connection end, an extension portion and an end cap, the extension portion is extended between the connection end and the end cap, and the extension portion comprises a hollow cavity therein;
   disposing the at least one electrical connection terminal respectively and correspondingly on the at least one electrical connection portion, so as to electrically connect the connection end of each of the at least one electrical connection terminal to a corresponding electrical connection portion;
   packaging the power module and the at least one electrical connection terminal through an encapsulant to form a packaged body;
   removing at least one portion of a surface of the packaged body for exposing the end cap of each of the at least one electrical connection terminal; and
   removing the end cap to expose the hollow cavity of each of the at least one electrical connection terminal, so as to form the power module package.

2. The method for forming the power module package as claimed in claim 1, wherein the hollow cavity of each of the at least one electrical connection terminal is adjacent to the end cap and occupies a portion of the extension portion.

3. The method for forming the power module package as claimed in claim 2, wherein the exposed hollow cavity of each of the at least one electrical connection terminal further receives at least one portion of a solder ball, and the at least one electrical connection terminal forms an external electrical connection through the solder ball.

4. The method for forming the power module package as claimed in claim 3, wherein the external electrical connection is formed by the at least one electrical connection terminal and the solder ball through at least one of a surface mount technology and a pin welding.

5. The method for forming the power module package as claimed in claim 3, wherein the solder ball received in the hollow cavity is electrically connected to a bridging terminal, and the bridging terminal is used to form the external electrical connection.

6. The method for forming the power module package as claimed in claim 2, wherein the hollow cavity of each of the at least one electrical connection terminal contains a solder material pre-set therein, and the solder material is exposed as the hollow cavity is exposed.

7. The method for forming the power module package as claimed in claim 1, wherein the hollow cavity of each of the at least one electrical connection terminal penetrates the extension portion for receiving an external pin terminal.

8. The method for forming the power module package as claimed in claim 7, wherein an inner wall of the hollow cavity has threads disposed thereon for fixing the external pin terminal through screwing.

9. The method for forming the power module package as claimed in claim 7, wherein the hollow cavity of each of the at least one electrical connection terminal contains an electrical connection fixing element pre-set therein, and the electrical connection fixing element is exposed while the hollower cavity is exposed, so as to fix the external pin terminal through engaging therebetween.

10. The method for forming the power module package as claimed in claim 1, wherein the at least one electrical connection terminal is further used to transmit a heat generated inside the power module package.

11. A power module package, comprising:
    a power module comprising at least one electrical element and at least one electrical connection portion;

at least one electrical connection terminal correspondingly and respectively disposed on the at least one electrical connection portion, wherein each of the at least one electrical connection terminal comprises a connection end, an extension portion and an end cap, the extension portion is extended between the connection end and the end cap and comprises a hollow cavity therein, and the connection end of each of the at least one electrical connection terminal is electrically connected to a corresponding electrical connection portion; and an encapsulant for packaging the power module and the at least one electrical connection terminal to form a packaged body, wherein at least one portion of a surface of the packaged body corresponding to each of the at least one electrical connection terminal is removed, and the end cap of each of the at least one electrical connection terminal is further removed to expose the hollow cavity of each of the at least one electrical connection terminal.

12. The power module package as claimed in claim 11, wherein the hollow cavity of each of the at least one electrical connection terminal is adjacent to the end cap and occupies a portion of the extension portion.

13. The power module package as claimed in claim 12, wherein the exposed hollow cavity of each of the at least one electrical connection terminal further receives at least one portion of a solder ball, and the at least one electrical connection terminal forms an external electrical connection through the solder ball.

14. The power module package as claimed in claim 13, wherein the external electrical connection is formed by the at least one electrical connection terminal and the solder ball through at least one of a surface mount technology and a pin welding.

15. The power module package as claimed in claim 13, wherein the solder ball received in the exposed hollow cavity is electrically connected to a bridging terminal, and the bridging terminal is used to form the external electrical connection.

16. The power module package as claimed in claim 12, wherein the hollow cavity of each of the at least one electrical connection terminal contains a solder material pre-set therein, and the solder material is exposed as the hollow cavity is exposed.

17. The power module package as claimed in claim 11, wherein the hollow cavity of each of the at least one electrical connection terminal penetrates the extension portion for receiving an external pin terminal.

18. The power module package as claimed in claim 17, wherein an inner wall of the hollow cavity has threads disposed thereon for fixing the external pin terminal through screwing.

19. The power module package as claimed in claim 17, wherein the hollow cavity of each of the electrical connection terminal contains an electrical connection fixing element preset therein, and the electrical connection fixing element is exposed while the hollower cavity is exposed, so as to fix the external pin terminal through engaging therebetween.

20. An electronic device, comprising:
a system circuit board; and
a power module package, comprising:
    a power module comprising at least one electrical element and at least one electrical connection portion;
    at least one electrical connection terminal respectively and correspondingly disposed on the at least one electrical connection portion, wherein each of the at least one electrical connection terminal comprises a connection end, an extension portion and an end cap, the extension portion is extended between the connection end and the end cap and comprises a hollow cavity therein, and the connection end of each of the at least one electrical connection terminal is electrically connected to a corresponding electrical connection portion; and
    an encapsulant for packaging the power module and the at least one electrical connection terminal to form a packaged body,
    wherein at least one portion of a surface of the packaged body corresponding to each of the at least one electrical connection terminal is removed, and the end cap of each of the at least one electrical connection terminal is further removed to expose the hollow cavity of each of the at least one electrical connection terminal,
wherein the power module package is electrically connected to the system circuit board through the at least one electrical connection terminal.

* * * * *